(12) United States Patent
Lin

(10) Patent No.: US 10,061,512 B2
(45) Date of Patent: Aug. 28, 2018

(54) DATA STORAGE DEVICE AND DATA WRITING METHOD THEREOF

(71) Applicant: Silicon Motion, Inc., Jhubei (TW)

(72) Inventor: Wen-Sheng Lin, Kaohsiung (TW)

(73) Assignee: Silicon Motion, Inc., Jhubei (TW)

( * ) Notice: Subject to any disclaimer, the term of this patent is extended or adjusted under 35 U.S.C. 154(b) by 0 days.

(21) Appl. No.: 15/659,203

(22) Filed: Jul. 25, 2017

(65) Prior Publication Data

US 2018/0101302 A1  Apr. 12, 2018

(30) Foreign Application Priority Data

Oct. 7, 2016 (TW) ................ 105132526 A

(51) Int. Cl.
*G11C 16/04* (2006.01)
*G06F 3/06* (2006.01)
*G06F 12/10* (2016.01)
*G06F 12/02* (2006.01)

(52) U.S. Cl.
CPC .......... *G06F 3/0604* (2013.01); *G06F 3/064* (2013.01); *G06F 12/0246* (2013.01); *G06F 12/10* (2013.01); *G06F 2212/657* (2013.01); *G06F 2212/7201* (2013.01)

(58) Field of Classification Search
CPC .... G06F 3/0604; G06F 3/064; G06F 12/0246; G06F 12/10; G06F 2212/657; G06F 2212/7201
See application file for complete search history.

(56) References Cited

U.S. PATENT DOCUMENTS

| 9,274,893 B2 * | 3/2016 | Chen ................ G06F 11/1402 |
| 9,619,321 B1 * | 4/2017 | Haratsch ............ G06F 11/1008 |
| 9,892,794 B2 * | 2/2018 | Micheloni ............ G11C 16/14 |

(Continued)

FOREIGN PATENT DOCUMENTS

| CN | 102591807 A | 7/2012 |
| DE | 102013106242 A1 | 4/2014 |

(Continued)

OTHER PUBLICATIONS

Office Action of corresponding TW application 105132526, published on Jun. 12, 2017.

(Continued)

*Primary Examiner* — Pho M Luu
(74) *Attorney, Agent, or Firm* — Wang Law Firm, Inc.

(57) ABSTRACT

A data storage device including a flash memory and a controller is provided. The flash memory has a plurality of TLC blocks, each of which includes a plurality of pages. The controller checks whether any of the TLC blocks was undergoing a write operation and unfinished at the time that the power-off event occurred when the data storage device resumes operation after a power-off event. When a first TLC block was undergoing the write operation and unfinished at the time that the power-off event occurred, the controller further checks whether data stored in a page which was the last one being written in the first TLC block can be successfully read, and continues to write the remaining data into the first TLC block when the data of the page which was the last one being written in the first TLC block can be successfully read.

16 Claims, 7 Drawing Sheets

(56) References Cited

U.S. PATENT DOCUMENTS

| | | |
|---|---|---|
| 2010/0169543 A1 | 7/2010 | Edgington |
| 2012/0284587 A1 | 11/2012 | Yu et al. |
| 2013/0024748 A1 | 1/2013 | Sharon et al. |
| 2014/0359346 A1 | 12/2014 | Chen |

FOREIGN PATENT DOCUMENTS

| | | |
|---|---|---|
| TW | 201011755 A | 3/2010 |
| TW | 201527970 A | 7/2015 |

OTHER PUBLICATIONS

Office Action of corresponding TW application, published on May 24, 2018.

\* cited by examiner

DATA STORAGE DEVICE AND DATA WRITING METHOD THEREOF

CROSS REFERENCE TO RELATED APPLICATIONS

This Application claims priority of Taiwan Patent Application No. 105132526, filed on Oct. 7, 2016, the entirety of which is incorporated by reference herein.

BACKGROUND OF THE INVENTION

Field of the Invention

The present invention is related to a data writing method for a data storage device, and in particular to a data writing method for Triple-Level Cell.

Description of the Related Art

Flash memory is considered a non-volatile data-storage device, using electrical methods to erase and program itself. NAND Flash, for example, is often used in memory cards, USB flash devices, solid state devices, eMMCs, and other memory devices.

Flash memory such as NAND Flash uses a multiple-block structure to store data, wherein flash memory uses floating gate transistors. The floating gates of the floating gate transistor may catch electronic charges for storing data. However, the electronics might undergo losses from the floating gate due to the operation of the flash memory or various environmental parameters, which can affect data retention. The Triple-Level Cell (TLC) of the flash memory is much more easily affected by the environment than a Single-Level Cell (SLC) or a Multi-Level Cell (MLC), especially during unexpected power-off events.

BRIEF SUMMARY OF THE INVENTION

A detailed description is given in the following embodiments with reference to the accompanying drawings.

An exemplary embodiment provides a data storage device including a flash memory and a controller. The flash memory has a plurality of TLC blocks, wherein each of the TLC blocks comprises a plurality of pages. The controller checks whether any of the TLC blocks undergoing a write operation is unfinished at the time that the power-off event occurred when the data storage device resumes operation after a power-off event, wherein when a first TLC block was undergoing a write operation and is unfinished at the time that the power-off event occurred, the controller further checks whether data stored in a page which was the last one being written in the first TLC block can be successfully read, and continues to write the remaining data into the first TLC block when the data of the page which was the last one being written in the first TLC block can be successfully read.

Another exemplary embodiment provides a data writing method applied to a data storage device, wherein the data storage device includes a flash memory having a plurality of TLC blocks. The data writing method includes: when the data storage device resumes operation after a power-off event, checking whether any of the TLC blocks was undergoing a write operation which is unfinished at the time that the power-off event occurred; when a first TLC block was undergoing a write operation which is unfinished at the time that the power-off event occurred, checking whether data stored in a page which was the last one being written in the first TLC block can be successfully read; and when the data of the page which was the last one being written in the first TLC block can be successfully read, continuing to write the remaining data into the first TLC block.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
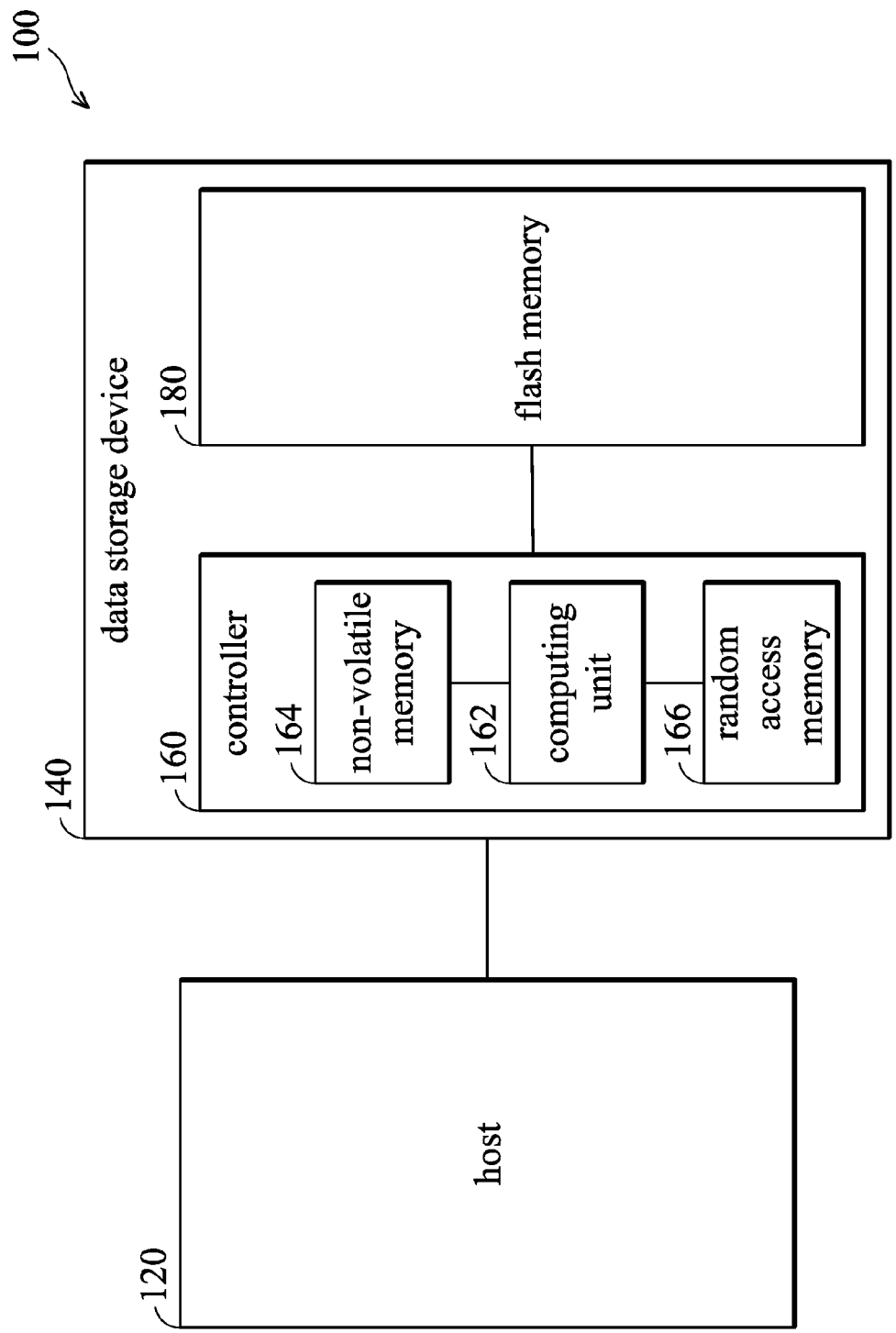
FIG. 1 is a schematic diagram illustrating an electronic system in accordance with an embodiment.

FIG. 1 is a schematic diagram illustrating an electronic system in accordance with an embodiment. The electronic system 100 includes a host 120 and a data storage device 140. The data storage device 140 includes a flash memory 180 and a controller 160, and operates in response to the commands of the host 120. The controller 160 includes a computing unit 162, a non-volatile memory 164 (ROM) and a random access memory 166 (RAM). The non-volatile memory 164, the program code stored in the non-volatile memory 164 and data stored in the non-volatile memory 164 constitute firmware executed by the processing unit 162, and the controller 160 is configured to control the flash memory 180 based on the firmware. The flash memory 180 includes a plurality of blocks, each of the blocks has a plurality of pages, wherein the minimum write unit of the flash memory 180 is a page, and the minimum erase unit of the flash memory 180 is a block. In some of the embodiments, the controller 160 may include an error correction engine arranged to perform Error Correction on the read data and encode the write data to obtain the parity codes, wherein the error correction engine may obtain the error bits of data stored in the page by reading the page.

Figure 2:
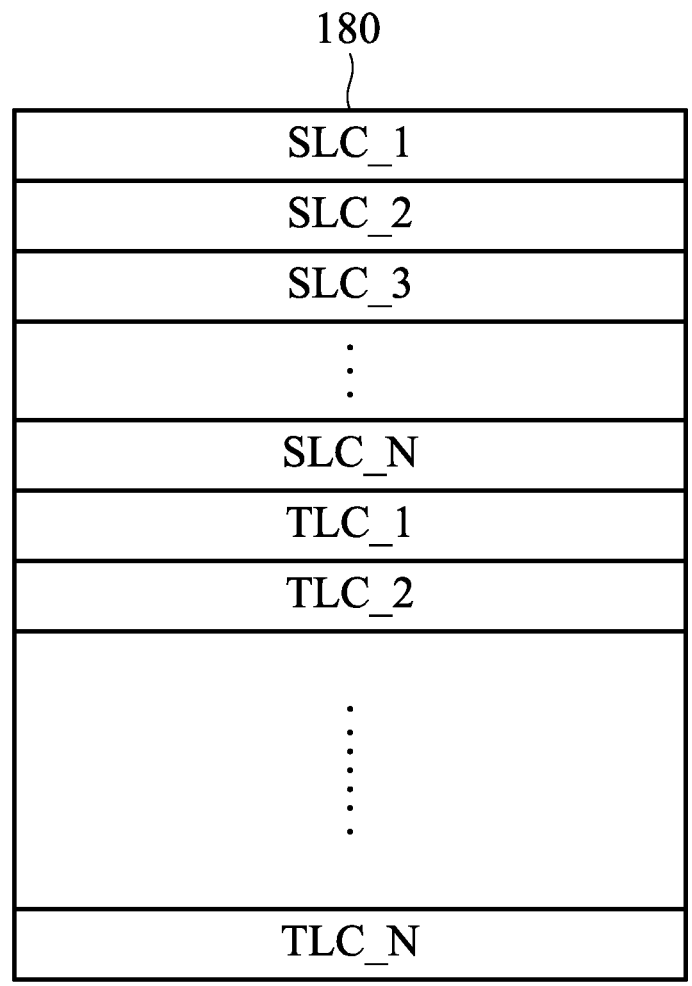
FIG. 2 is a schematic diagram illustrating a flash memory in accordance with an embodiment.

In one of the embodiments, the blocks of the flash memory 180 may include a plurality of SLC blocks SLC_1~SLC_N and a plurality of TLC blocks TLC_1~TLC_N (as shown in FIG. 2), wherein each of the SLC blocks SLC_1~SLC_N has a plurality of pages, and each of the TLC blocks TLC_1~TLC_N also has a plurality of pages. The SLC blocks SLC_1~SLC_N are arranged to be written with data by a Single-Level Cell mode (SLC mode), and the TLC blocks are arranged to be written with data by a Triple-Level Cell mode (TLC mode). Moreover, the memory space of each of the TLC blocks TLC_1~TLC_N is three times larger than the memory space of each of the SLC blocks SLC_1~SLC_N. More specifically, all of the pages of the TLC blocks and the SLC blocks have the same physical construction. However, the page of the TLC block has to be programmed by a specific voltage more than one time to be written with data, and the page of the SLC block only has to be programmed by a specific voltage one time to be written with data. In one embodiment, the page of the TLC block has to be programmed by a specific voltage three times to be written with data. Namely, the valid data of three SLC blocks can be written into one TLC block, but it is not limited thereto.

It should be noted that the flash memory 180 of the present invention is operated as Triple-Level Cell (TLC), and the flash memory 180 also includes some blocks arranged to be operated as Single-Level Cell (SLC). Before the data is stored into the TLC blocks TLC_1~TLC_N, the data has to store into the SLC blocks SLC_1~SLC_N first. During the period of storing data, the controller 160 is configured to read a predetermined number of SLC blocks a predetermined number of times to program the data of the read SLC blocks into a TLC block. More specifically, when the controller 160 needs to write data into a specific TLC block of the flash memory 180, the controller 160 will write the data into a predetermined number of specific SLC blocks first. Next, the controller 160 performs a predetermined number of read operations on the specific SLC blocks to program the read data into the specific TLC block. Namely, the write operation of the TLC blocks is arranged to program the data stored in the predetermined number of SLC blocks into the TLC block.

Figure 3:
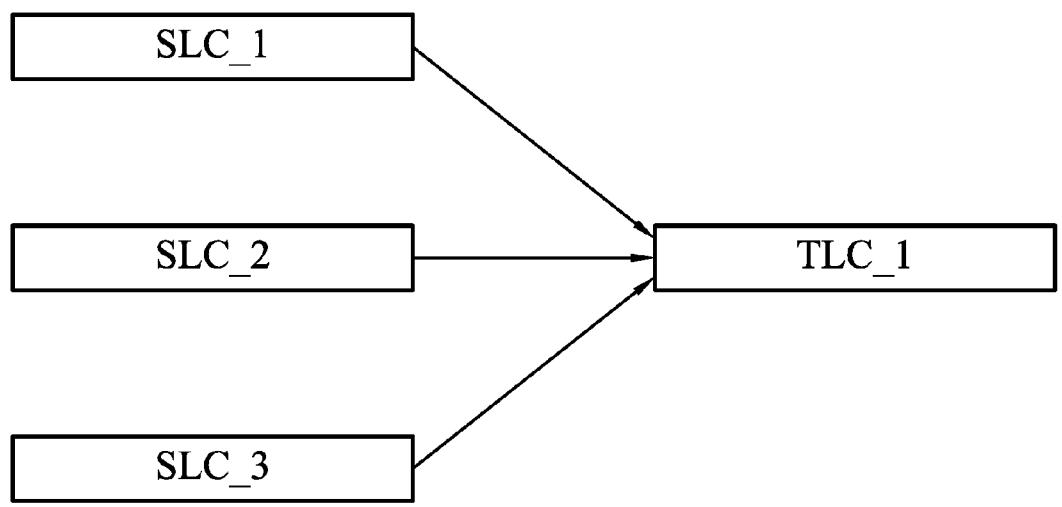
FIG. 3 is a schematic diagram illustrating relationships of SLC and TLC blocks in accordance with an embodiment.

In one embodiment, the predetermined number of SLC blocks is three, but it is not limited thereto. In other embodiments, the predetermined number can be 4, 5, 6, 7, 8 or other positive integer. For example, the controller 160 is required to write data into a specific TLC block TLC_1 of the flash memory 180, as shown in FIG. 3. Firstly, the controller 160 writes the data into three of the specific SLC blocks SLC_1~SLC_3. Next, the controller 160 performs a first read operation on the first page of each of the specific SLC blocks SLC_1~SLC_3 to program the first page of the specific TLC block TLC_1 according to the data read from the first pages of the specific SLC blocks SLC_1~SLC_3 for the first time. Next, the controller 160 performs a second read operation on the same first page of each of the specific SLC blocks SLC_1~SLC_3 to program the same first page of the specific TLC block TLC_1 according to the data read from the first pages of the specific SLC blocks SLC_1~SLC_3 for the second time. Lastly, the controller 160 performs a third read operation on the same first page of each of the specific SLC blocks SLC_1~SLC_3 to program the same first page of the specific TLC block TLC_1 according to the data read from the first pages of the specific SLC blocks SLC_1~SLC_3 for the third time. From the above three instances of programming, the data stored in the first page of each of the SLC blocks SLC_1~SLC_3 has written into the first page of the specific TLC block TLC_1. Similarly, the controller 160 continues to repeat the above steps until the data of all the pages of the specific SLC blocks SLC_1~SLC_3 has been written into the specific TLC block TLC_1.

As described above, writing the TLC blocks TLC_1~TLC_N takes more time than writing the SLC blocks. Therefore, there is a greater chance of a power-off event occurring during the write operations of TLC blocks TLC_1~TLC_N. In one embodiment, when a power-off event has occurred during a write operation of a TLC block, the controller 160 selects a new TLC block and writes the data of the SLC blocks, which was arranged to be written into the original TLC block, into the new TLC block. It should be noted that the controller 160 may determine whether a power-off event has occurred during the write operation of TLC block according to the tables stored in the flash memory 180 (or other memory) when the data storage device 140 resumes operation after the power-off event. For example, the flash memory 180 may have a table arranged to record when a write operation of the page or block was started and another table arranged to record whether the write operation is finished. In this embodiment, the controller 160 may determine whether the write operation is interrupted according to the above two tables of the flash memory 180, but it is not limited thereto. In other embodiments, the data storage device 140 can also record the status of writing data according to at least one table or flag. Moreover, if any of the pages of the TLC block has not been written, the write operation of the TLC block is unfinished.

In some conditions, such as the manufacturing process or testing process of the data storage device 140, the data storage device 140 is more likely to continually suffer from power failure attacks. Therefore, the above method of writing the data into another new TLC block will cause the controller 160 to continuously select a new block and cannot finish the current write operation, wasting the resources of the TLC block and the controller 160.

In view of this, in one of the embodiments of the present invention, when the data storage device resumes operation after a power-off event, the controller 160 checks whether any of the TLC blocks was undergoing a write operation which is unfinished at the time that the power-off event occurred. When a first TLC block was undergoing a write operation which is unfinished at the time that the power-off event occurred, the controller 160 further checks whether data stored in a page which was the last one being written in the first TLC block can be successfully read. It should be noted that, in this invention, if the data cannot be successfully read, it means that the controller 160 cannot correct all the error bits in the data read from the page by error correction or other methods. On the other hand, if the data can be successfully read, it means that the controller 160 has corrected all the error bits in the data read from the page by error correction or another method. When the data of the page can be successfully read, the controller 160 will not abandon the first TLC block, and continue to write the remaining data into the first TLC block to finish the write operation of the first TLC block. When the data of the page cannot be successfully read, the controller 160 selects a third TLC block from the TLC blocks, and writes the data of the write operation which was arranged to be written into the first TLC block into the third TLC block. Namely, the controller 160 writes the data in the SLC blocks, which was arranged to be written into the first TLC block, into the third TLC block. It should be noted that the controller 160 selects the TLC block which is not the first TLC block and does not have valid data to serve as the third TLC block, but it is not limited thereto. In other embodiments, the controller 160 can also select the new TLC block according to the erase count, write count and/or other parameters.

In one of the embodiments, when the write operation of the first TLC block is finished, the controller 160 further checks whether the number of error bits of each of the pages in the first TLC block is higher than a first predetermined number. When any of the numbers of error bits of the pages in the first TLC block is higher than the first predetermined number, the controller 160 selects a second TLC block from the other TLC blocks to write the data of the write program which was arranged to be written into the first TLC block into the second TLC block, but it is not limited thereto. It should be noted that the first predetermined number can be determined by the circuit designer or can be the value given in the specifications, wherein the circuit designer may determine the first predetermined number according to the error correction ability of the circuit. For example, the maximum number of error bits that can be corrected is 50, and the circuit designer can set the first predetermined number to 45~50, but it is not limited thereto. Namely, the first predetermined number is arranged to determine whether the data can be successfully corrected now or in the future.

In another embodiment, when the data stored in the page which was the last one being written in the first TLC block can be successfully read and the number of error bits of the read data is higher than a second predetermined number, controller 160 further moves the data which was written in the first TLC block before the power-off event occurred to a temporary block of the flash memory 180. Namely, the controller 160 stores the data read from the page or the whole first TLC block into the temporary block. In this embodiment, the temporary block is an SLC block or a TLC block in the flash memory 180, and the temporary block is arranged to temporarily store unstable data of other blocks. When the unstable data of blocks is lost or cannot be corrected, the controller 160 can obtain the correct copy of the unstable data from the temporary block. It should be noted that the second predetermined number can be determined by the circuit designer or can be the value given in the specifications, wherein the circuit designer may determine the second predetermined number according to the error correction ability of the circuit. For example, the maximum number of error bits that can be corrected is 50, the circuit designer can set the second predetermined number to 45~50, but it is not limited thereto. Namely, the second predetermined number is arranged to determine whether the data can be successfully corrected now or in the future.

Moreover, when no power-off event has occurred during the write program performed on any TLC block, the controller 160 continues to perform other tasks and bypasses the step of checking the numbers of error bits of the pages in the TLC block. Namely, when no power-off event has occurred since the write operation of the first TLC block is started until the write operation is finished, the controller 160 will not check whether the number of error bits of any page of the first TLC block is higher than a first predetermined number.

Figure 4:
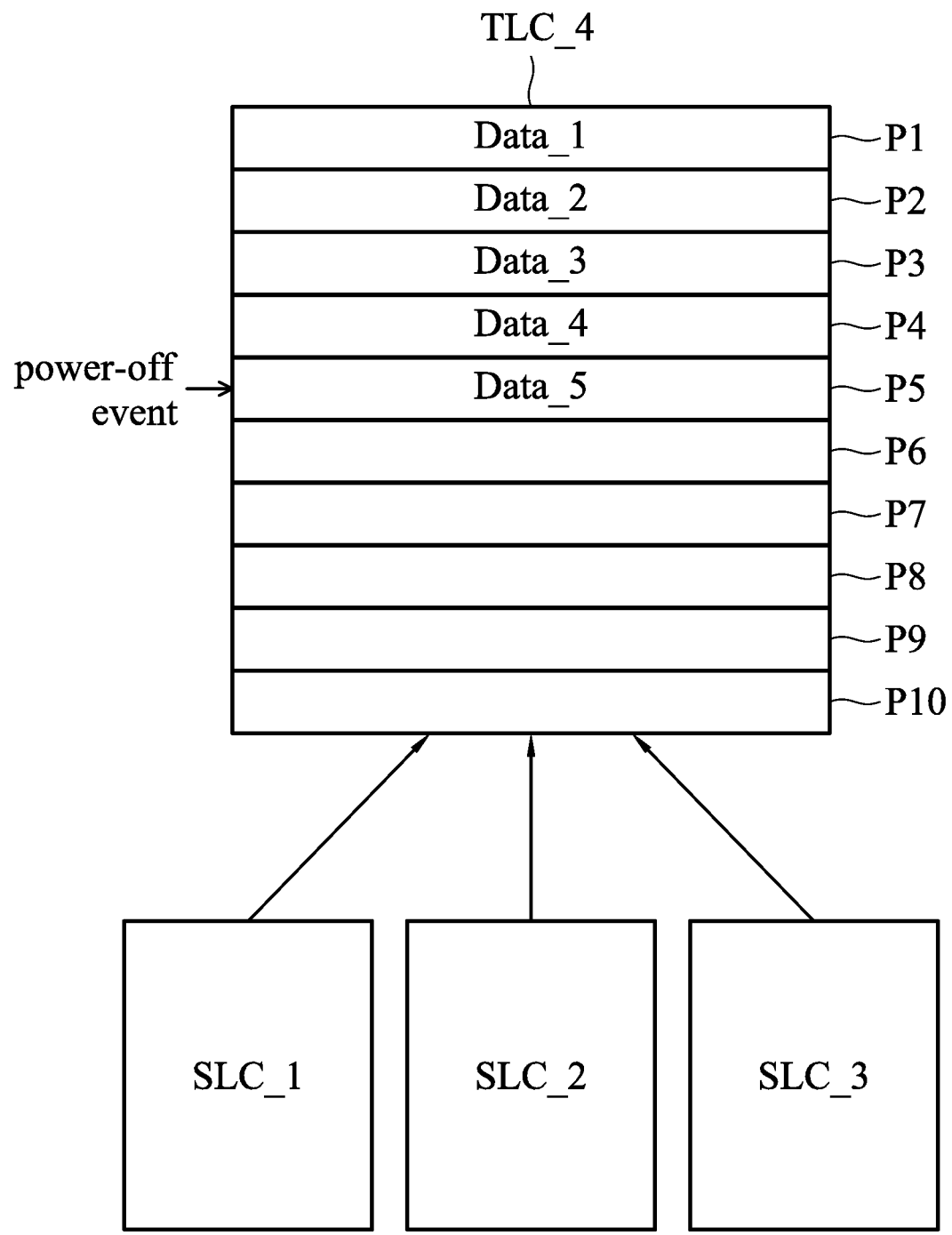
FIG. 4 is a schematic diagram illustrating a write operation of SLC and TLC blocks in accordance with an embodiment.

For example, as shown in FIG. 4, the controller 160 programs the data stored in the SLC blocks SLC_1~SLC_3 into the TLC block TLC_4 if the data Data_1~Data_4 are written in the pages P1~P4, and a power-off event occurred at the time that the controller 160 was writing the data Data_5 into the page P5 of the TLC block TLC_4. In this embodiment, the controller 160 obtains the TLC block TLC_4 by checking whether any of the TLC blocks was undergoing a write operation which was unfinished at the time that the power-off event occurred when the data storage device resumes operation after a power-off event. Namely, the controller 160 determines that the write operation of TLC block TLC_4 is unfinished. Next, the controller 160 checks whether the data stored in the page P5 which was the last one being written in the TLC block TLC_4 can be successfully read.

When the data stored in the page P5 can be successfully read, the controller 160 will not abandon the TLC block TLC_4, and will continuously write the remaining data into the TLC block TLC_4 from the page P6 of the TLC block TLC_4 to finish the write operation of the first TLC block. Namely, the controller 160 starts to write data into the TLC block TLC_4 from the page P6 until the page P10 of the TLC block TLC_4 is also filled. Moreover, when the data of the page P5 of the TLC block TLC_4 can be successfully read and the number of error bits of the data read from the page P5 is higher than the second predetermined number, the controller 160 further writes the data Data_5 which is read from the page P5 into a temporary block of the flash memory 180. Alternatively, when the data of the page P5 of the TLC block TLC_4 can be successfully read and the number of error bits of the page P5 is higher than the second predetermined number, the controller 160 further reads the data Data_1~Data_5 stored in the pages P1~P5 and writes the read data Data_1~Data_5 into the temporary block of the flash memory 180, and finishes the write program of the TLC block TLC_4. Next, when the write operation of the TLC block TLC_4 is finished (all of the pages P1~P10 of the TLC block TLC_4 are filled), the controller 160 checks whether the number of error bits of any of the pages P1~P10 of the TLC block TLC_4 is higher than a first predetermined number. When the number of error bits of any of the pages P1~P10 of the TLC block TLC_4 is higher than a first predetermined number, the controller 160 selects another TLC block (ex. the TLC block TLC_5) from the TLC blocks TLC_1~TLC_N to write the data, which was arranged to be written into the TLC block TLC_4, into the TLC block TLC_5. Namely, the controller 160 writes the data stored in the SLC blocks SLC_1~SLC3 into the TLC block TLC_5.

Conversely, when the data of the page P5 cannot be successfully read, the controller 160 selects a TLC block (ex. the TLC block TLC_5) which does not have valid data from the TLC blocks TLC_1~TLC_N to write all the data of the original TLC block TLC_4 into the TLC block TLC_5. Namely, the controller 160 writes the data stored in the SLC blocks SLC_1~SLC3 into the TLC block TLC_5.

Figure 5:
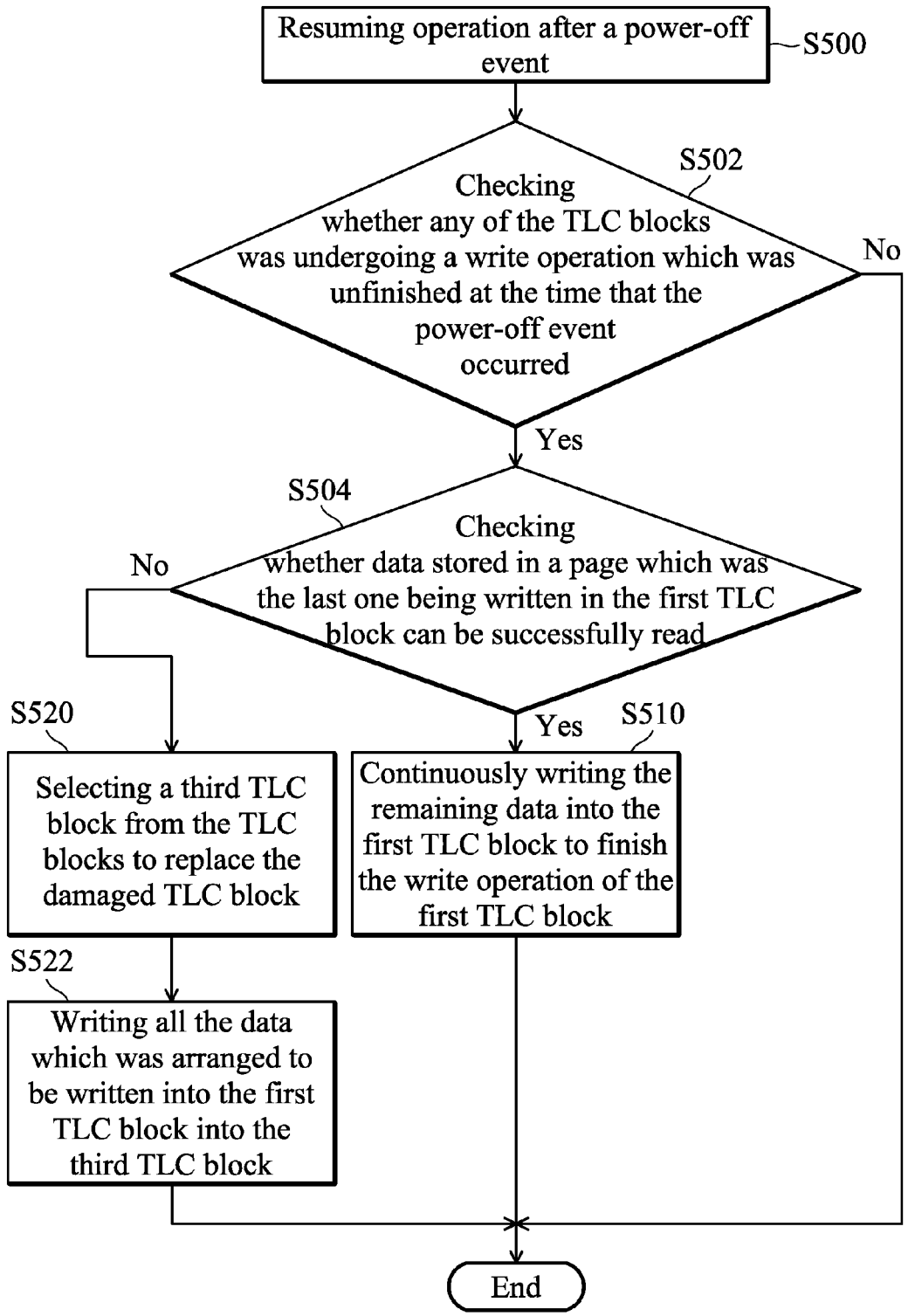
FIG. 5 is a flowchart of a data writing method in accordance with an embodiment.

FIG. 5 is a flowchart of a data writing method in accordance with an embodiment. The data writing method is applied to the data storage device 140 of FIG. 1. The process starts at step S500.

In step S500, the data storage device 140 resumes operation after a power-off event. It should be noted that a power-off event of the present invention may include events in which the power of the data storage device 140 is expectedly or unexpectedly cut off, but it is not limited thereto. In other embodiments, the power-off event may only be an event in which the data storage device 140 is unexpectedly cut off.

Next, in step S502, the controller 160 checks whether any of the TLC blocks of the flash memory 180 was undergoing a write operation which was unfinished at the time that the power-off event occurred. When the controller 160 determines that a first TLC block of the flash memory 180 was undergoing a write operation which was unfinished at the time that the power-off event occurred, the process goes to step S504. When the controller 160 determines that no write operation was unfinished at the time that the power-off event occurred, the process ends at step S502.

In step S504, the controller 160 checks whether data stored in a page which was the last one being written in the first TLC block can be successfully read. When the data stored in a page which was the last one being written in the first TLC block can be successfully read, the process proceeds to step S510. When the pages of the first TLC block cannot be successfully read, the process goes to step S520. It should be noted that, in this invention, if the data cannot be successfully read, it means that the controller 160 cannot correct all the error bits in the data read from the page by error correction or another method. On the other hand, if the data can be successfully read, it means that the controller 160 has corrected all the error bits in the data read from the page by error correction or another method.

In step S510, the controller 160 will not abandon the original first TLC block, and will continuously write the remaining data into the first TLC block to finish the write operation of the first TLC block. The process ends at step S510.

In step S520, the controller 160 selects a third TLC block from the TLC blocks to replace the damaged TLC block. It should be noted that the controller 160 is arranged to select the TLC block which is not the first TLC block and does not have valid data to serve as the third TLC block, but it is not limited thereto. In other embodiments, the controller 160 can also select the new TLC block according to the erase count, write count and/or other parameters.

Next, in step S522, the controller 160 writes all the data which was arranged to be written into the first TLC block into the third TLC block. Namely, the controller 160 writes the data in the SLC block which was arranged to be written into the first TLC block into the third TLC block. The process ends at step S522. It should be noted that when no power-off event has occurred during the write operation of the TLC block, the controller 160 continues to perform other tasks and bypasses the step of checking the numbers of error bits of the pages in the TLC block. Namely, when no power-off event has occurred since the write operation of the first TLC block was started until the write operation is finished, the controller 160 will not check whether the number of error bits of any page of the first TLC block is higher than a first predetermined number.

Figure 6A:
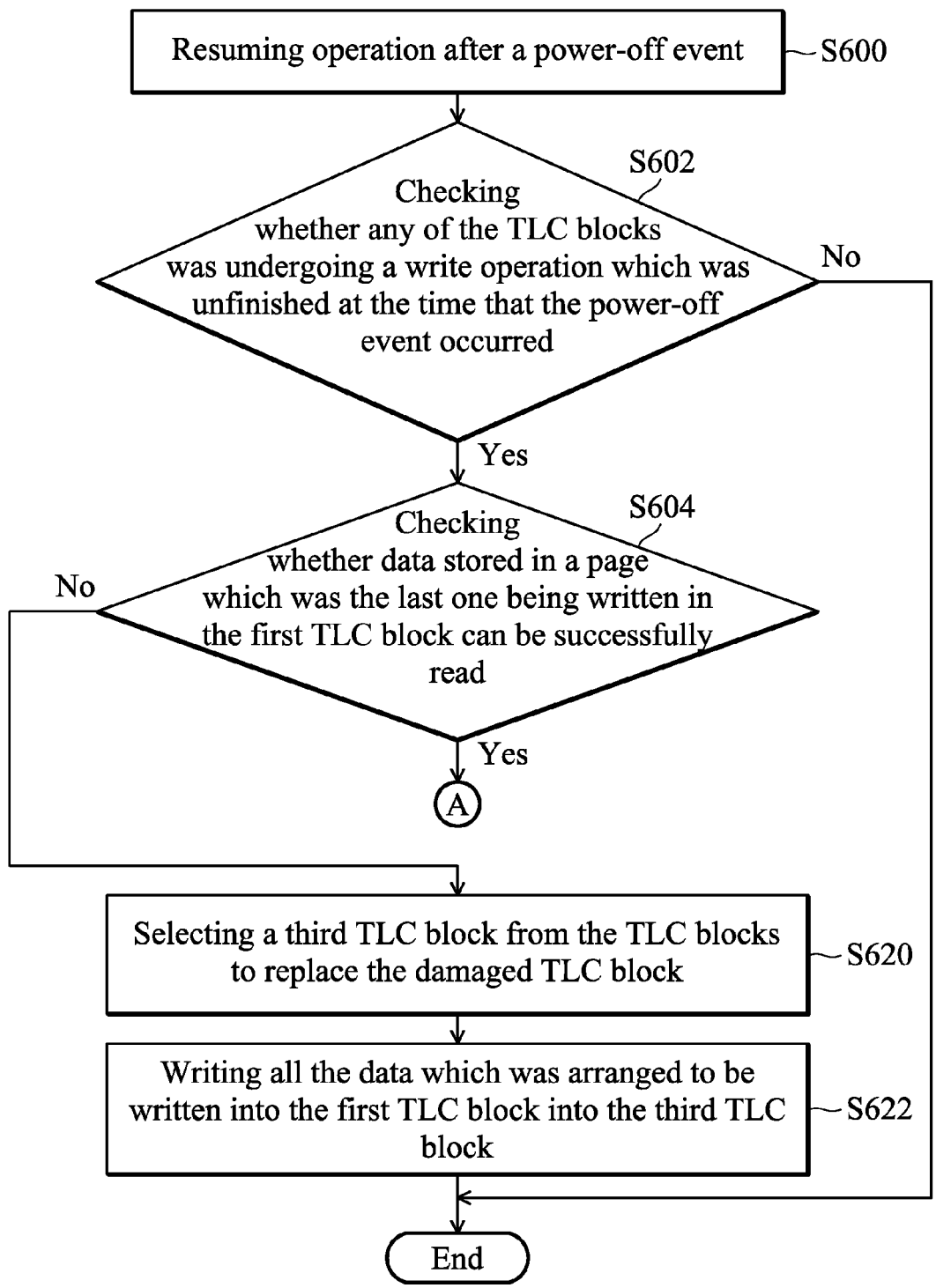
FIGS. 6A-6B are a flowchart of a data writing method in accordance with another embodiment.
Figure 6B:
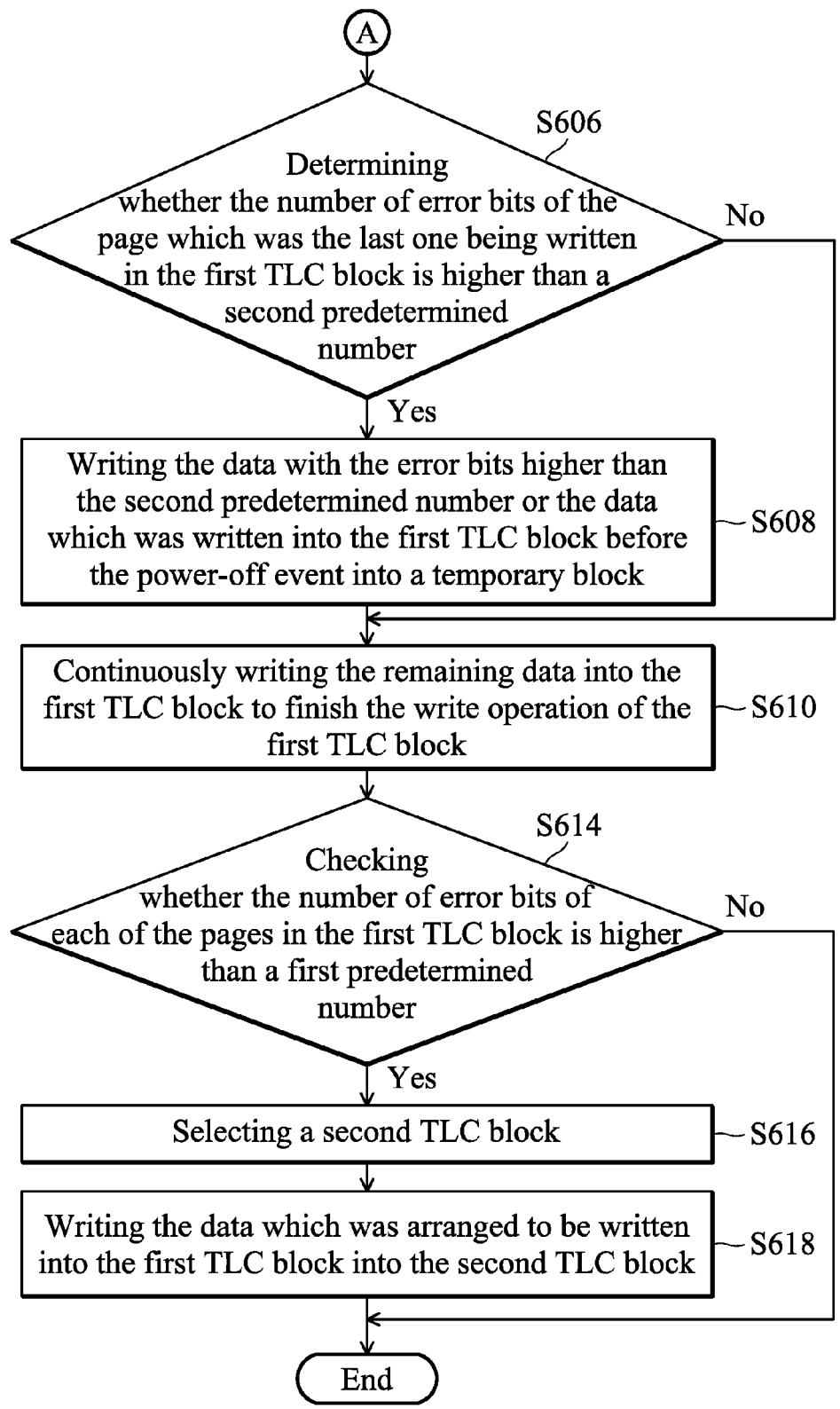

FIGS. 6A-6B are a flowchart of a data writing method in accordance with another embodiment. The data writing method is applied to the data storage device 140 of FIG. 1. The process starts at step S600. Steps S600, S602, S604, S610, S620 and S622 are similar to steps S500, S502, S504, S510, S520 and S522 of FIG. 5, such that the details of steps S600, S602, S604, S610, S620 and S622 can be referred to in FIG. 5.

In step S606, when the data of the page which was the last one being written in the first TLC block can be successfully read, the controller 160 determines whether the number of error bits of the page which was the last one being written in the first TLC block is higher than a second predetermined number. When the page which was the last one being written in the first TLC block is higher than the second predetermined number, the process goes to step S608, otherwise, the process goes to step S610.

In step S608, the controller 160 writes the data with the error bits higher than the second predetermined number or the data which was written into the first TLC block before the power-off event into a temporary block of the flash memory 180. Namely, the controller 160 writes the data with the error bits higher than the second predetermined number or all of the data of the first TLC block into the temporary block.

In step S614, the controller 160 checks whether the number of error bits of each of the pages in the first TLC block is higher than a first predetermined number. When any of the numbers of error bits of the pages in the first TLC block is higher than the first predetermined number, the process goes to step S616, otherwise, the process ends at step S614.

Next, in step S616, the controller 160 selects a second TLC block from the TLC blocks. It should be noted that the controller 160 selects the TLC block which is not the first TLC block and does not have valid data to serve as the second TLC block, but it is not limited thereto. In other embodiments, the controller 160 can also select the second TLC block according to the erase count, write count and/or other parameters.

Next, in step S618, the controller 160 writes the data which was arranged to be written into the first TLC block into the second TLC block. Namely, the controller 160 writes the data stored in the SLC blocks corresponding to the first TLC block into the second TLC block. The process ends at step S618.

As described above, the data storage device 140 and the data writing method of the present invention can continue to use the TLC block which was undergoing writing when a power-off occurred to avoid wasting the TLC block and reduce the erase count of the TLC blocks. Moreover, the data storage device 140 and the data writing method of the present invention can also bypass the checking of the TLC blocks which were not undergoing a write operation during the power-off event to increase the efficacy of the data storage device 140.

Data transmission methods, or certain aspects or portions thereof, may take the form of program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
a flash memory, having a plurality of TLC blocks, wherein each of the TLC blocks comprises a plurality of pages; and
a controller, checking whether any of the TLC blocks was undergoing a write operation which was unfinished at the time that the power-off event occurred when the data storage device resumes operation after a power-off event, wherein when a first TLC block was undergoing a write operation which was unfinished at the time that the power-off event occurred, the controller further checks whether data stored in a page which was the last one being written in the first TLC block can be successfully read, and continues to write the remaining data into the first TLC block when the data of the page which was the last one being written in the first TLC block can be successfully read.

2. The data storage device as claimed in claim 1, wherein the flash memory has a plurality of SLC blocks, and each of the SLC blocks comprises a plurality of pages, wherein the write operation is arranged to program a predetermined size of data stored in the SLC blocks into one of TLC blocks.

3. The data storage device as claimed in claim 1, wherein when all of the remaining data of the write operation is written into the first TLC block, the controller checks whether a number of error bits of each of the pages in the first TLC block is higher than a first predetermined number.

4. The data storage device as claimed in claim 3, wherein when any of the numbers of error bits of the pages in the first TLC block is higher than the first predetermined number, the controller selects a second TLC block from the other TLC blocks to write the data of the write operation which was arranged to be written into the first TLC block into the second TLC block.

5. The data storage device as claimed in claim 4, wherein when no power-off event has occurred during the write operation performed on the second TLC block, the controller continues to perform other tasks and bypasses a step of checking the numbers of error bits of the pages in the second TLC block after the write operation performed on the second TLC block is finished.

6. The data storage device as claimed in claim 1, wherein when the data of the page which was the last one being written in the first TLC block can be successfully read and the number of error bits of the page which was the last one being written in the first TLC block is higher than a second predetermined number, the controller further moves the data which was written in the first TLC block before the power-off event occurred to a temporary block of the flash memory.

7. The data storage device as claimed in claim 1, wherein when the data of the page which was the last one being written in the first TLC block cannot be successfully read, the controller selects a third TLC block from the TLC blocks to write the data of the write operation which was arranged to be written into the first TLC block into the third TLC block.

8. The data storage device as claimed in claim 7, wherein the controller selects the TLC block which is not the first TLC block and does not have valid data to serve as the third TLC block.

9. A data writing method, applied to a data storage device, wherein the data storage device comprises a flash memory having a plurality of TLC blocks, and the data writing method comprises:
  when the data storage device resumes operation after a power-off event, checking whether any of the TLC blocks was undergoing a write operation and which was unfinished at the time that the power-off event occurred;
  when a first TLC block was undergoing the write operation and which was unfinished at the time that the power-off event occurred, checking whether data stored in a page which was the last one being written in the first TLC block can be successfully read; and
  when the data of the page which was the last one being written in the first TLC block can be successfully read, continuing to write the remaining data into the first TLC block.

10. The data writing method as claimed in claim 9, wherein the flash memory has a plurality of SLC blocks, and each of the SLC blocks comprises a plurality of pages, wherein the write operation is arranged to program a predetermined size of data stored in the SLC blocks into one of TLC blocks.

11. The data writing method as claimed in claim 9, further comprising when all of the remaining data of the write operation is written into the first TLC block, checking whether the number of error bits of each of the pages in the first TLC block is higher than a first predetermined number.

12. The data writing method as claimed in claim 11, further comprising:
  when any of the numbers of error bits of the pages in the first TLC block is higher than the first predetermined number, selecting a second TLC block from the other TLC blocks; and
  writing the data of the write operation which was arranged to be written into the first TLC block into the second TLC block.

13. The data writing method as claimed in claim 12, further comprising when no power-off event has occurred during the write operation performed on the second TLC block, continuing to perform other tasks and bypassing the step of checking the numbers of error bits of the pages in the second TLC block after the write operation performed on the second TLC block is finished.

14. The data writing method as claimed in claim 9, wherein when the data of the page which was the last one being written in the first TLC block can be successfully read, the data writing method further comprises:
  determining whether the number of error bits of the page which was the last one being written in the first TLC block is higher than a second predetermined number; and
  when the number of error bits of the page which was the last one being written in the first TLC block is higher than a second predetermined number, writing the data which was written in the first TLC block before the power-off event occurred into a temporary block of the flash memory.

15. The data writing method as claimed in claim 9, further comprising:
  when the data of the page which was the last one being written in the first TLC block cannot be successfully read, selecting a third TLC block from the TLC blocks; and
  writing the data of the write operation which was arranged to be written into the first TLC block into the third TLC block.

16. The data writing method as claimed in claim 15, wherein the step of selecting the third TLC block from the TLC blocks further comprises selecting the TLC block which is not the first TLC block and does not have valid data to serve as the third TLC block.

* * * * *